United States Patent
O'Connell et al.

(10) Patent No.: US 9,214,935 B2
(45) Date of Patent: Dec. 15, 2015

(54) OUTPUT MODULE FOR INDUSTRIAL CONTROL WITH SINK AND SOURCE CAPABILITY AND LOW HEAT DISSIPATION

(75) Inventors: John O'Connell, Painesville, OH (US); Dale Terdan, Concord Township, OH (US); David A. Pasela, Seven Hills, OH (US); Charmaine J. Van Minnen, Aurora, OH (US); Bret S. Hildebran, Chagrin Falls, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 836 days.

(21) Appl. No.: 13/473,711

(22) Filed: May 17, 2012

(65) Prior Publication Data

US 2013/0307514 A1     Nov. 21, 2013

(51) Int. Cl.
*H03K 17/785* (2006.01)
*H03K 17/687* (2006.01)

(52) U.S. Cl.
CPC .......... *H03K 17/785* (2013.01); *H03K 17/6874* (2013.01)

(58) Field of Classification Search
CPC ................... H03K 17/6874; H03K 17/785
See application file for complete search history.

(56) References Cited

U.S. PATENT DOCUMENTS 5,448,161 A * 9/1995 Byerley et al. ............... 324/72
5,804,991 A * 9/1998 Hu ................................ 327/162
5,909,135 A * 6/1999 Baldwin et al. .............. 327/328
7,864,546 B2 * 1/2011 Dhuyvetter et al. .......... 363/17
7,973,562 B1   7/2011 Zhang et al.

FOREIGN PATENT DOCUMENTS

EP     0700101 A1    3/1996
EP     2339749 A1    6/2011
GB     2185164 A     7/1987

OTHER PUBLICATIONS

Vishay Semiconductors, Mar. 20, 2012 Application Note 60, "SSR Design Using VO1263". website: http://www.vishay.com/docs/81225/ssrvo126.pdf.*
ABB 2006 System Description Document, "Freelance 800F distributed control system" (hereinafter ABB). 3BDD 010 023 EN B 10.200 . website http://www.foz.unioeste.br/~romeu/CIP/Freelance_800F_System_Description.pdf.*
Vishay, 2008 Datasheet, "Dual Photovoltaic MOSFET Driver Solid State Relay"Document No. 84639 250 Rev. 1.6, May 7, 2008.*
Vishay Siliconix, Nov. 2, 2009 Product Sheet No. 70785, "Bi-Directional P-Channel MOSFET/Power Switch".*
Partial European Search Report dated Sep. 15. 2014, Application No. 13168278.3—(6) pages.

* cited by examiner

*Primary Examiner* — Robert Fennema
*Assistant Examiner* — Fenyang Stewart
(74) *Attorney, Agent, or Firm* — Boyle Fredrickson, S.C.

(57) ABSTRACT

An I/O circuit for use with an industrial controller provides a photovoltaic optical isolator communicating between a controller and a field-side of the I/O circuit, the photovoltaic optical isolator eliminating the need for high wattage power dropping circuits for powering the field-side of the I/O circuit from high-voltage field signals. The field effect transistor type transistors permit use of the low-power photovoltaic optical isolator while allowing flexible connections to various field circuit types.

27 Claims, 7 Drawing Sheets

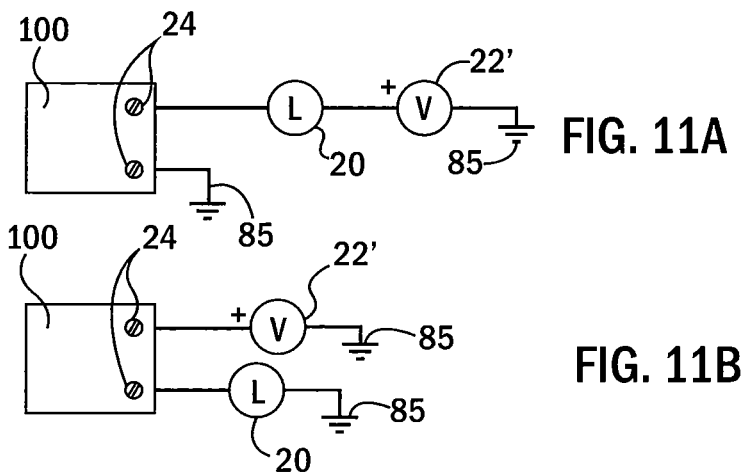
FIG. 11A
FIG. 11B
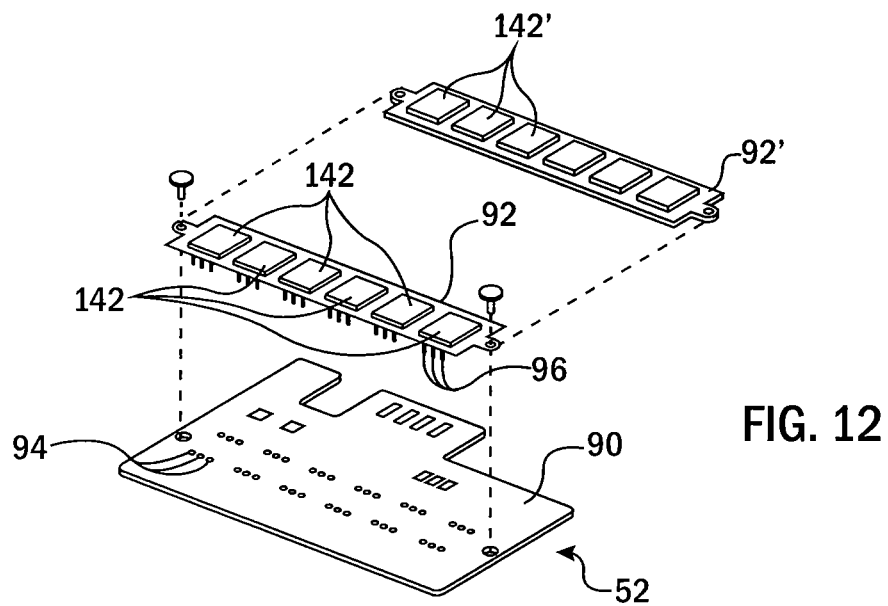
FIG. 12

OUTPUT MODULE FOR INDUSTRIAL CONTROL WITH SINK AND SOURCE CAPABILITY AND LOW HEAT DISSIPATION

BACKGROUND OF THE INVENTION

The present invention relates to I/O modules for industrial control systems and in particular to a low heat dissipation I/O module that may flexibly accommodate the digital control of AC or DC power.

Industrial controllers are specialized computer systems used for the control of industrial processes or machinery, for example, in a factory environment. Industrial controllers differ from conventional computers in a number of ways. Physically, they are constructed to be substantially more robust against shock and damage and to better resist external contaminants and extreme environmental conditions. The processors and operating systems are optimized for real-time control and execute languages allowing ready customization of programs to comport with a variety of different controller applications. Further, the controllers have a highly modular architecture that allows different numbers and types of input and output modules to be used to connect the controllers to the process or machinery to be controlled. This modularity is facilitated through the use of special "control networks" suitable for highly reliable and available real-time communication. Such control networks (for example, Ethernet IP) differ from standard communication networks (e.g. Ethernet) by guaranteeing maximum communication delays, for example, as obtained by pre-scheduling the bandwidth of the network, and/or providing redundant communication capabilities to high-availability.

As part of their enhanced modularity, industrial controllers may employ I/O modules dedicated to a particular type electrical signal and function, for example, detecting input AC or DC signals or controlling output AC or DC signals. Each of these I/O modules may have a connector system allowing them to be installed in different combinations in a housing or rack along with other selected I/O modules to match the demands of the particular application. Multiple racks may be located at convenient control points near the controlled process or machine to communicate with a central industrial controller via a special control network such as Ethernet IP.

Normally different I/O modules are required for the control of AC and DC signals reflecting differences in the control devices used for the signals (e.g. triacs versus transistors). Different I/O DC modules may be required depending on whether the DC signal is "sourced" from the DC output module or "sinked" into the DC output module.

Normally the circuitry of the I/O module communicating with the industrial controller (controller-side) is optically isolated from the circuitry communicating with the controlled process or machine (field-side) in order to prevent faults in the field-side from damaging the industrial control system or other I/O modules. For output circuits (such as AC output or DC output circuits), it can be necessary to provide a source of low voltage DC for operation of the field-side circuitry independent of the power available on the controller-side. Often this is done through the use of a voltage dropping resistance converting the high voltages controlled by the I/O module into a lower voltage suitable for powering the field-side circuitry. Such voltage dropping resistors are often physically large to handle the necessary power dissipation and must be spaced apart to aid in dissipating the incident heat.

The control of AC voltages is often provided by a triac or thyristor that may be switched at a zero crossing of the AC signal (to reduce electrical switching noise and power dissipation) by a conventional trigger circuit relying on a phase shifted version of the AC signal being controlled.

SUMMARY OF THE INVENTION

The present invention provides an output circuit for an I/O module eliminating the need for high wattage, power-dropping resistors for generating field-side power through the use of a photovoltaic optical isolator which generates its own electrical power through optical energy conversion. The use of the photovoltaic optical isolator is rendered practical by switching the controlled power using high-voltage field effect transistors instead of conventional triacs. Slow turnoff times incident to the low power output of a photovoltaic optical isolator and high impedance of the field effect transistors are managed by an active pulldown transistor detecting the beginning of control voltage reduction. The use of FETs allows the circuit to be used both for AC and DC sourcing and DC sinking operation.

Zero crossing detection may be obtained by the use of an independent zero crossing detector allowing flexible control of AC waveforms by switching the waveform based on a variable phase relationship with the zero crossing of the waveform.

More specifically, one embodiment of the present invention provides an I/O module circuit for use in an industrial control system and having a housing supporting terminals for receipt of electrical power to be controlled by the I/O module circuit. A circuit contained in the housing includes: at least one field effect transistor having a source and drain in series between the terminals to control current flow through the terminals according to a signal received by a gate of the field effect transistor, a photovoltaic voltage optical isolator having a photovoltaic stack connecting to the gate of the field effect transistor and optically isolated from a light emitting diode, and a releasable electrical connector also supported by the housing receiving a signal indicating a desired control of electrical power at the terminals of the I/O module, the signal controlling current through the light emitting diode.

It is thus a feature of at least one embodiment of the invention to provide an output I/O module that does not require voltage dropping resistors for developing field-side power. It is a feature of at least one embodiment of the invention to provide an I/O module with reduced heat dissipation allowing more compact design and/or the elimination of cooling features such as fans or fans subject to failure or environmental contamination.

The circuit contained in the housing may include two series connected FETs and the photovoltaic stack is connected from a junction at connected sources of the two series connected FETs to gates of the two series connected FETs.

It is thus a feature of at least one embodiment of the invention to provide a versatile output that can be used to control AC and DC sinking and DC sourcing control configurations. It is a feature of at least one embodiment of the invention to provide for a high impedance solid-state device that may be powered practically from a photovoltaic stack.

The I/O module circuit may further include an active pulldown transistor connected between the gates of the first and second FETs and the junction at the two series connected FETs.

It is thus a feature of at least one embodiment of the invention to provide rapid turn off to the FETs to reduce power dissipation in the FETs during turnoff.

The I/O module circuit may further include a diode separating the photovoltaic stack from a connection of the active pulldown transistor to the gates of the FETs and a control input of the active pulldown transistor may be connected to the photovoltaic stack on opposite sides of the diode from the gates of the FETs.

It is thus a feature of at least one embodiment of the invention to provide a system for rapid turn off of the FETs that does not provide substantial load (or power dissipation) when the FETs are in the on state. It is a further feature of at least one embodiment of the invention to preserve a full on state of the FET transistors as driving voltage decays until a rapid switch off is initiated, thereby further reducing unnecessary power dissipation in the FETs.

The I/O module circuit may further include a pulldown resistor across photovoltaic stack.

It is thus a feature of at least one embodiment of the invention to provide a mechanism to flexibly control and provide certainty in switch off speed of the system.

The I/O module circuit may further include a zero crossing detector connected to the terminals for detecting a zero crossing of an AC waveform connected to the terminals to control a switching of the FET at a time related to a zero crossing of the AC waveform.

It is thus a feature of at least one embodiment of the invention to provide a circuit that can switch rapidly on or off during or a predetermined offset in time from zero crossings of the control power for reducing power dissipation and electrical interference or for providing modulation of an AC signal for power control and the like.

The I/O module circuit may further include an electronic circuit receiving an input of the zero crossing detector and the signal indicating a desired control of electrical power at the terminals of the I/O module and operating to control application of the signal indicating a desired control of electrical power at the terminals of the I/O module to the light emitting diode to be coincident with a zero crossing of the AC waveform.

It is thus a feature of at least one embodiment of the invention to permit flexible change in the phase relationship between zero crossing and the switching of the transistors for novel control applications.

In one embodiment, the invention provides for field-side power that is floating with respect to the control side power allowing the output transistors to be used in either sink or source mode without a special jumper or the like.

Specifically, the invention may provide an I/O module circuit for use in an industrial control system having a housing, with terminals supported by the housing for receipt of electrical power to be controlled by the I/O module circuit and a circuit contained in the housing. The circuit may provide at least one field effect transistor having a source and drain in series between the terminals to control current flow through the terminals according to a first electrical signal received by a gate of the field effect transistor. A releasable electrical connector supported by the housing receives a second electrical signal indicating a desired control of electrical power at the terminals of the I/O module and a power isolator receives at a first controller-side the second signal, and providing at a second field-side output power and the first signal communicating information of the second signal. The output power is derived from input electrical power received at the first controller-side of the power isolator but isolated and floating with respect to that input power and the first signal is isolated and floating with respect to the second signal.

It is thus a feature of at least one embodiment of the invention to permit an output FET be used in sinking or sourcing configuration by floating the gate control with respect to external field-side power and its connection.

In one embodiment of the invention, the invention provides an isolated source of field-side power using magnetic coupling.

Specifically, the invention may provide an I/O module circuit for use in an industrial control system having a housing, with terminals supported by the housing for receipt of electrical power to be controlled by the I/O module circuit, and a circuit contained in the housing. The circuit may include at least one field effect transistor having a source and drain in series between the terminals to control current flow through the terminals according to a first signal received by a gate of the field effect transistor and at least one transformer-coupled isolator receiving input electrical power referenced to a second signal isolated with respect to the second signal to provide output electrical power referenced to the first signal of floating with respect to the second signal.

It is thus a feature of at least one embodiment of the invention to provide for substantial isolated power transfer from the control side to the field-side using magnetic coupling to provide for rapid turn off and turn off times of the FET commensurate with low impedance driving.

These particular objects and advantages may apply to only some embodiments falling within the claims and thus do not define the scope of the invention.

BRIEF DESCRIPTION OF THE DRAWINGS

FIGS. 11a and 11b are figures similar to FIGS. 6b and 6c showing possible sinking and sourcing configurations of the output of the power control block; and FIG. 12 is a figure similar to FIG. 7 showing a replaceable FET module for the configuration of FIG. 8.

DETAILED DESCRIPTION OF THE PREFERRED EMBODIMENT

Figure 1:
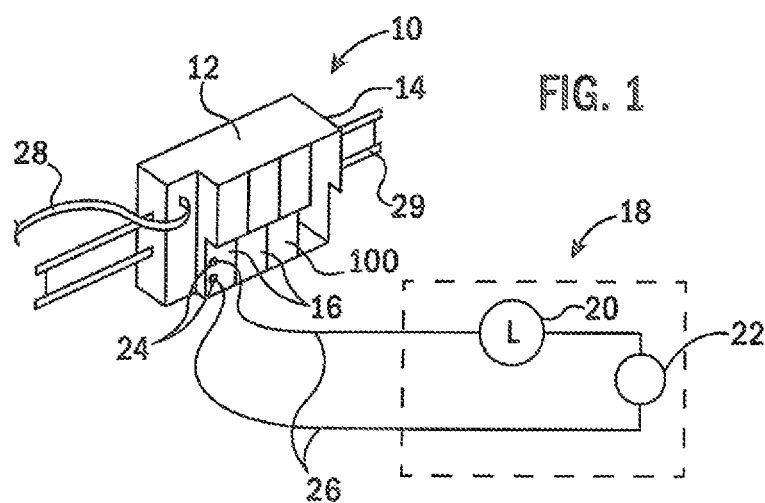
FIG. 1 is a perspective view of a remote I/O rack of a type suitable for use with the present invention showing a rack housing having multiple I/O modules contained therein for communication with an industrial process via terminals and a remote industrial controller via a network cable.
Figure 2:
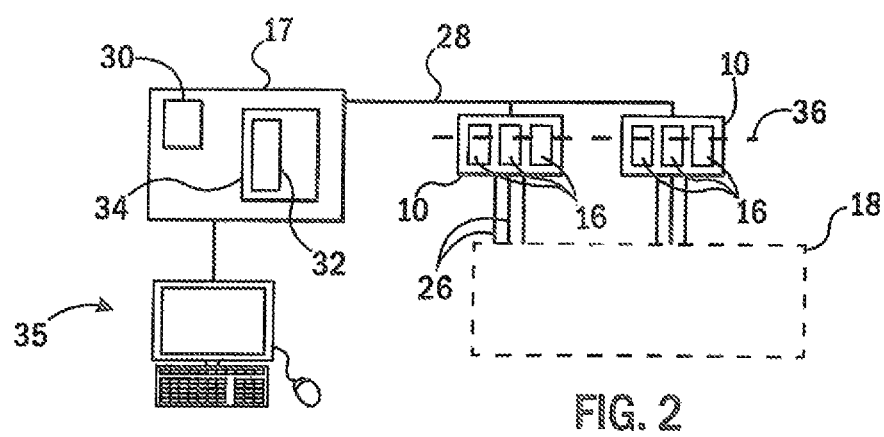
FIG. 2 is a block diagram showing the I/O rack of FIG. 1 in the context of the industrial control system incorporating multiple remote I/O racks and an industrial controller.

Referring now to FIGS. 1 and 2, an I/O rack 10 may provide for a rack housing 12 having multiple openings 14 for orienting and supporting corresponding replaceable I/O modules 16. The I/O modules 16 generally provide an electrical interface between an industrial controller 17 and an industrial process or machine 18, the latter having actuators presenting loads 20 as powered by external field-side power sources 22 which may be AC sources (as shown) or DC sources as will be described. The rack housing 12 may also include a dedicated DC output I/O module 100, as discussed in more detail below. Each of the I/O modules 16 may have exposed screw terminals 24 or similar releasable terminals for connecting circuitry of the I/O module 16 via electrical conductors 26 to the load 20 and field-side power source 22 of the industrial process or machine 18.

The housing 12 of the I/O rack 10 may be supported, for example, on a DIN rail 29 of a type known in the art or may provide for other mounting arrangements allowing it to be located close to the desired controlled loads 20. The I/O rack 10 may connect via a control network 28, for example, Ethernet IP, to industrial controller 17 for communication of control data between the I/O modules 16 of the I/O rack 10 and the industrial controller 17.

Generally, the industrial controller 17 will include at least one processor 30 executing a stored control program 32 contained in a communicating memory 34 to provide for communication with the control network 28 to exchange signals with the I/O rack 10 for control of the industrial process or machine 18 according to a stored control program 32. The stored control program 32 reads signals indicating the state of the industrial process or machine 18 (from sensors or the like) and writes outputs to the I/O rack 10 to control the loads 20 according to those sensed inputs and the logic of the control program 32. The industrial controller 17 may include a connection to a user interface terminal 35 (for example including a display, computer, keyboard, and mouse or the like) allowing programming and other control of the industrial controller 17 and providing for output of information to an operator. Industrial controllers 17 suitable for use with the present invention include, for example, programmable controllers commercially available from Rockwell Automation, Inc.

Some of the I/O modules 16 of each I/O rack 10 may include a provision for an isolation barrier 36 (indicated by the like numbered dotted line in FIG. 2) between the electrical power and circuitry of the industrial process or machine 18, and directly connected portions of the I/O module 16 and the circuitry of the industrial control system including the industrial controller 17, the network 28, the racks 10 and remaining portions of the I/O modules 16. Circuitry on the side of the isolation barrier 36 toward the industrial process or machine 18 will be termed "field-side" circuitry and circuitry on the side of the electrical isolation towards the industrial controller 17 will be termed "controller-side" circuitry. Electrical isolation, as is understood in the art, may be accomplished by an optical isolator or transformer that prevents DC conduction through the isolation barrier 36 to prevent damage to the controller-side circuitry in the event of fault on the field-side circuitry. This isolation prevents simple sharing of electrical power between the circuits on the controller-side in the field-side by conductors spanning the isolation barrier 36.

I. AC Output Module

Figure 3:
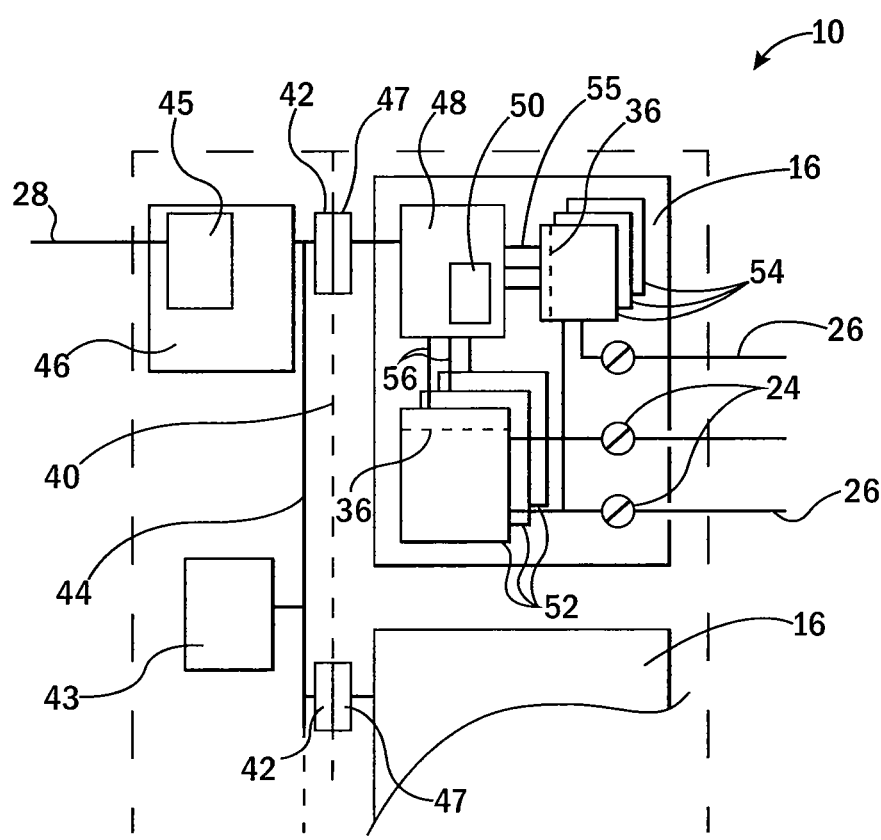
FIG. 3 is a block diagram of the remote I/O rack showing connectors for attaching I/O modules installed in the rack to a common bus communicating with the network cable and electrical power, and showing one I/O module providing a power control circuit and a zero crossing circuit controlled by a microcontroller.

Referring now to FIG. 3, each I/O rack 10 may provide a backplane 40 providing a set of electrically releasable electrical connectors 42 communicating with a backplane bus 44 providing parallel or serial digital communication and electrical power. Electrical power may be provided by a power supply 43. The digital communication on the backplane bus 44 may be moderated by a rack controller 46 including network circuit 45 communicating with the industrial control network 28. The rack controller 46 and network circuit 45 may be, for example, one or more electronic processors executing a stored program stored in memory or the like.

The electrical connectors 42 forming the backplane bus 44 may connect with corresponding electrical connectors 47 positioned at the rear of each I/O module 16 allowing electrical connection between controller-side circuitry of the I/O rack 10 and the controller-side circuitry of the I/O module 16 for directly communicating data and power therebetween when an I/O module 16 is inserted into the I/O rack 10. Within each I/O module 16, a module controller 48 may execute a stored program 50 to coordinate functions of the I/O module 16 by communicating with multiple output circuits 52 and corresponding single shared or multiple zero crossing detector circuits 54. Each of these output circuits 52 and zero crossing detector circuits 54 may provide internally for isolation barrier 36 between controller-side and field-side circuitry as will be described. Each of these output circuits 52 and zero crossing detector circuits 54 also communicates with a shared set of terminals 24 (only three shown for clarity) that may, for example, be screw type terminals releasably receiving electrical conductors 26. Generally two of the terminals 24 will connect to line voltage (if needed for zero crossing detection) and a third will provide a switched output.

As will be understood in the art, the zero crossing detector circuit 54 provides a detection of zero crossing of the waveform applied to the terminals 24 connected to the line voltage to produce a zero crossing signal 55 transmitted to the module controller 48 and indicating the timing of the zero crossing of the AC waveform on the terminals 24. The zero crossing detector circuits may be any of a wide variety of different circuit types, for example, circuits receiving an AC signal through a full wave rectifier that drives a conventional optocoupler. The optocoupler's input may be in series with a voltage threshold sensitive device (such as a zener diode or a properly configured transistor) providing a switching near the zero crossings of the AC signal to produce a pulse zero crossing signal 55 near the zero crossing of the AC signal.

The module controller 48 receiving this zero crossing signal 55 provides a switch state signal 56 for each output circuit 52 indicating a desired control of electrical power at the terminals 24 (based on signal 56). In one mode of operation, conduction between terminals 24 (switch state) is changed by output circuit 52 (either by opening or closing the circuit between terminals 24) only at the zero crossings of the AC waveform on the terminals 24 to reduce power dissipation in the internal switching elements used to control power conducted through the terminals 24 to accommodate the architecture of the switching element characteristics (for example when a thyristor is used), and/or to reduce the generation of electromagnetic interference.

In another mode of operation, conduction between the terminals 24 may be changed by the output circuit 52 (again either by opening or closing the circuit between terminals 24)

at a predetermined offset from the zero crossing. This allows modulation of the AC signal, for example, to control power to a load by switching the AC signal on and off with different duty cycles much in the manner of pulse width modulation. Unlike conventional triac circuitry, the VET transistors 76 and 78 (as illustrated in FIG. 4) may both switch on and off at any point in the cycle of the AC waveform.

Figure 4:
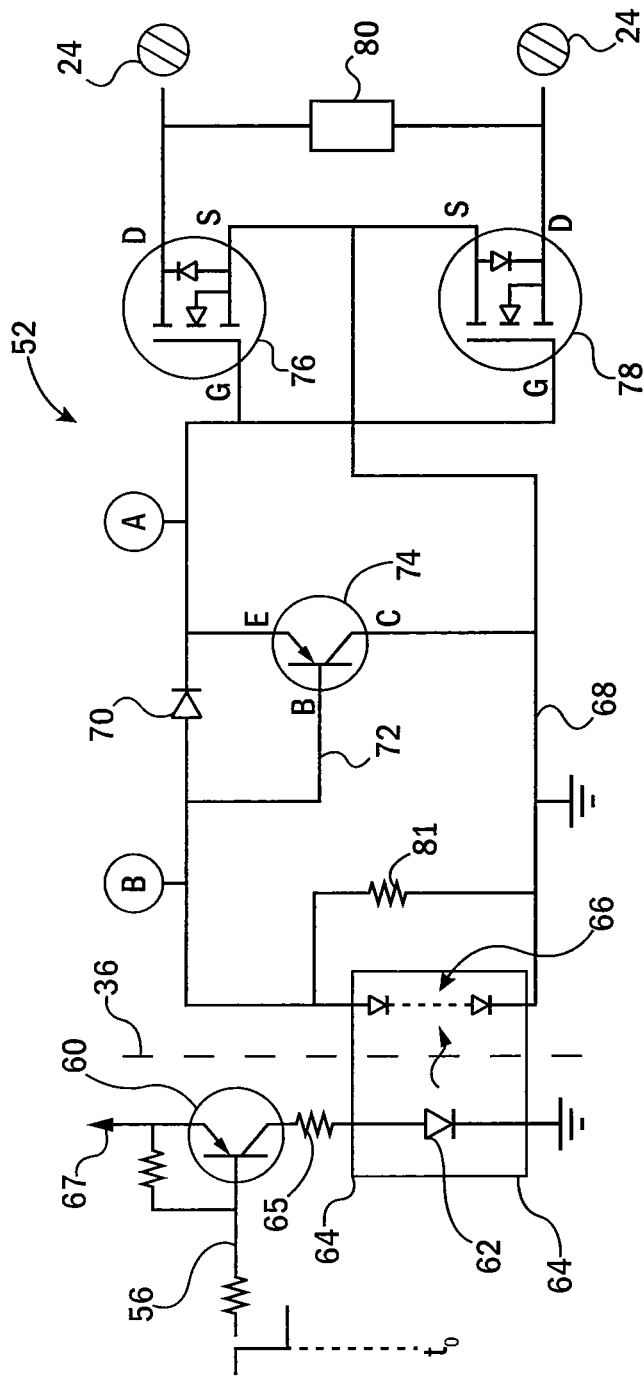
FIG. 4 is a detailed schematic of the power control block of FIG. 3 such as may receive a control signal to control an AC or DC signal at output terminals.

Referring now to FIG. 4, the output circuit 52 may receive a switch state signal 56 from the controller 17, for example, at the base of the PNP transistor 60. The PNP transistor 60 may in turn drive an LED 62 in a photovoltaic optocoupler 64. The emitter of the PNP transistor 60, for example, may be connected to a controller-side power source 67 being a positive DC voltage and a collector of the PNP transistor 60 may connect to through current-limiting resistor 65 to the anode of the LED 62 whose cathode is connected to ground of the controller-side power source 67. Light from the LED 62, when the transistor 60 is on, may generate electrical voltage on the photovoltaic pile 66 comprised of a set of series connected photodiodes. The photovoltaic pile 66 may provide a positive voltage at an anode of the photovoltaic pile 66 connected to circuit point B with reference to a cathode of the photovoltaic pile 66, the latter connected to field circuit internal ground 68. Thus, voltage applied at signal 56 results in an increase in voltage at circuit point B. A bypass resistor 81 is placed to shunt the photovoltaic pile 66 to improve the response time of the circuit as will be described below.

Circuit point B connects to the anode of a diode 70 and to the base 72 of a PNP pull-down transistor 74 whose collector is connected to the field circuit internal ground 68 and whose emitter connects with the cathode of diode 70 at circuit point A. Circuit point A connects in turn to the gates of two back-to-back series connected metal oxide semiconductor field effect (MOSFET) transistors 76 and 78. Transistor 76 has its drain connected to a first terminal 24 and its source connected to the source of second transistor 78. Second transistor 78 has its drain connected to the second terminal 24. The junction between transistors 78 and 76 is connected to the field circuit internal ground 68. An MOV voltage-limiting device 80 is placed to shunt the terminals 24 to protected transistors 76 and 78 from high-voltage spikes from conductors 26 and load-stored inductive energy.

Transistors 76 and 78 are connected in series such that when transistor 76 is conducting in first quadrant mode, transistor 78 is conducting in third quadrant mode. If polarity is reversed, transistor 76 will conduct in third quadrant mode and transistor 78 will conduct in first quadrant mode. First quadrant mode is drain positive and source negative, third quadrant is source positive and drain negative with n channel devices.

Figure 5:
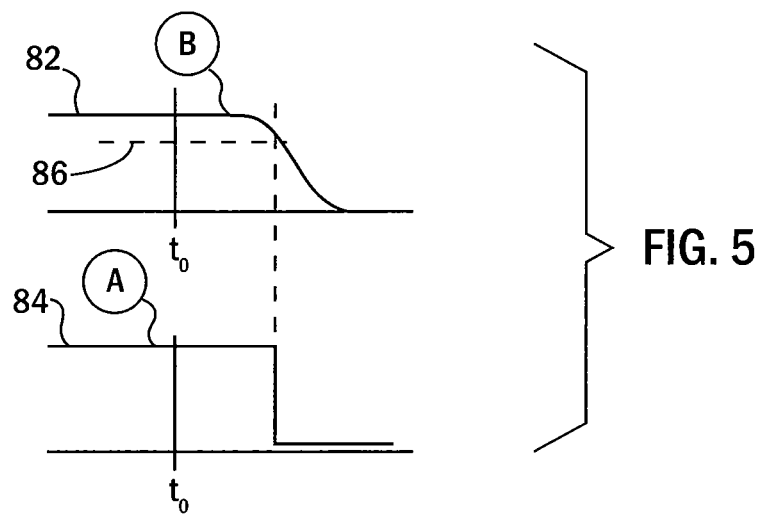
FIG. 5 is graphs of two waveforms at points within the power control block during a turning off of the controlled power and showing the action of an active pulldown transistor to provide for sharp turn off of controlled power.

Referring now to FIGS. 4 and 5, it will be appreciated that when the LED 62 is conducting (before time $t_0$) the voltage 82 at circuit point B rises to a high state turning off pull-down transistor 74 and biasing point A and the gates of transistors 76 and 78 to a similar high state at voltage 84 substantially equal to voltage 82. This biasing of the transistors 76 and 78 allows bipolar conduction of current between terminals 24 through the transistors 76 and 78.

When the LED 62 is deenergized (after time $t_0$), the voltage 82 at point B drops as a result of current passing through a bypass resistor 81 shunting the photovoltaic pile 66. As the voltage 82 at point B drops, the voltage at point A remains relatively high by virtue of the blocking action of diode 70 and the high impedance of the gates of transistors 76 and 78, continuing the conduction of the transistors 76 and 78 in a low impedance conduction mode. As long as the declining voltage 82 at point B remains above a transistor turn on voltage 86, pull-down transistor 74 is back biased to remain off, preserving the voltage level of A at voltage 84. When the voltage at point B drops below the voltage 86, pull-down transistor 74 turns on, rapidly pulling the voltage level A near to ground. This rapid turn off reduces power dissipation in the transistors 76 and 78 during a turn off of these transistors. As noted, turn off and turn on of the transistors 76 and 78 may be synchronized to zero crossings of an AC waveform, with the decay of waveform at point B being relatively short by virtue of the bypass resistor 81.

Figure 6A:
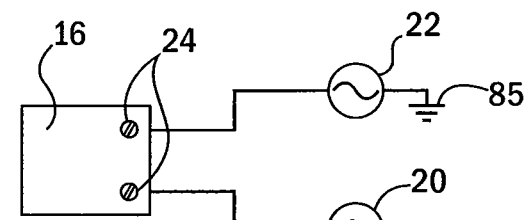
FIGS. 6a-c are different connection configurations possible between the I/O module of the present invention and the controlled circuitry showing configurations for controlling AC and DC signals in sourcing and sinking configurations.
Figure 6B:
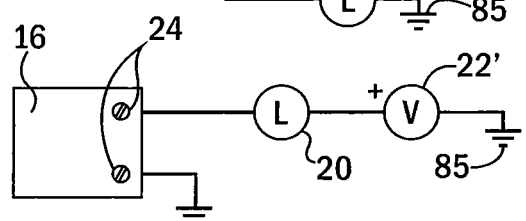
Figure 6C:
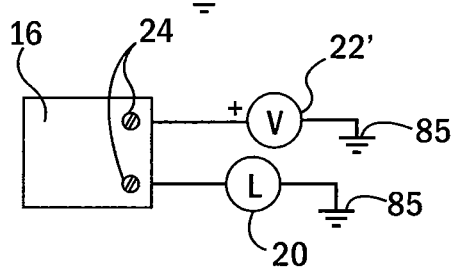

Referring now to FIGS. 6a-6c, the use of MOSFET transistors 76 and 78, as shown, permit a number of different configurations of the load 20 and field-side power source 22 and connection to the terminals 24 of the I/O module 16. In a conventional AC control situation, per FIG. 6a, an AC field-side power source 22 may be connected between a field-side ground and either of the terminals 24 and the load 20 connected between the remaining terminal 24 and the field-side ground 84. Similarly, but not shown, the load 20 may be placed in any other location in the circuit path shown including between the field-side power source 22 and the terminal 24. In this way versatile AC signal control may be obtained.

It should be emphasized that the grounds associated with the field-side power sources 22 (external field side grounds 84) are distinct from the internal field-side ground 68 described above and the two should not be connected. The ability of the internal field side ground 68 to float with respect to the external field side grounds 84 provides the flexibility of the current circuit.

Referring to FIG. 6b, for the control of a DC circuit including DC field-side power source 22', the I/O module 16 may act as a "sinking" module with the load 20 connected between a positive terminal of the field-side power source 22' and one terminal 24 and the remaining terminal 24 connected to ground. Alternatively, as shown in FIG. 6c, the positive terminal of the field-side power source 22' may be connected directly to a terminal 24 and the remaining terminal 24 may be connected to the load 20 which then leads to ground in a so-called "sourcing" mode.

Figure 7:
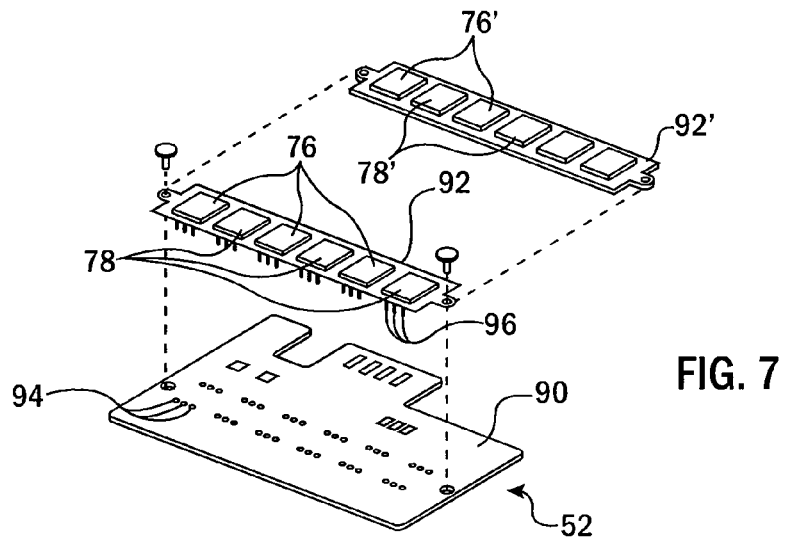
FIG. 7 is an exploded perspective view of a circuit board realizing a portion of the present invention showing a replaceable FET module.

Referring now to FIG. 7, in one embodiment, the output circuit 52 may provide for a printed circuit board 90 associated with multiple removable modules 92 and 92' that may be alternatively releasably attached to the printed circuit board 90, for example, through electrical connector sockets 94 on the printed circuit board 90 and corresponding pins 96 on the modules 92 or 92'. The module 92 may hold the FET transistors 76 and 78 having a first voltage or current characteristic (for example, high-voltage operation) and the module 92' may hold FET transistors 76' and 78' having a different voltage or current characteristic (for example, higher current operation but lower voltage operation than transistors 76 and 78). The printed circuit board 90 may hold the remaining circuitry of the output circuit 52, allowing the FET transistors 76 and 78 to be selected between high-voltage FET transistors and lower voltage higher current FET transistors by simply plugging in one or the other of modules 92 or 92'. In this way, a single I/O module 16 may provide for a wide range of different interface types, including both AC and DC voltages configured in different ways as discussed above with respect to FIG. 6 and having different voltage or current requirements, by the replacement of the module 92 or 92' at a distributor or in the field.

It will be appreciated that many modifications may be made to the circuit including, for example, use of the photovoltaic optocoupler 64 with other solid-state switching ele-

II. DC Output Module

Figure 8:
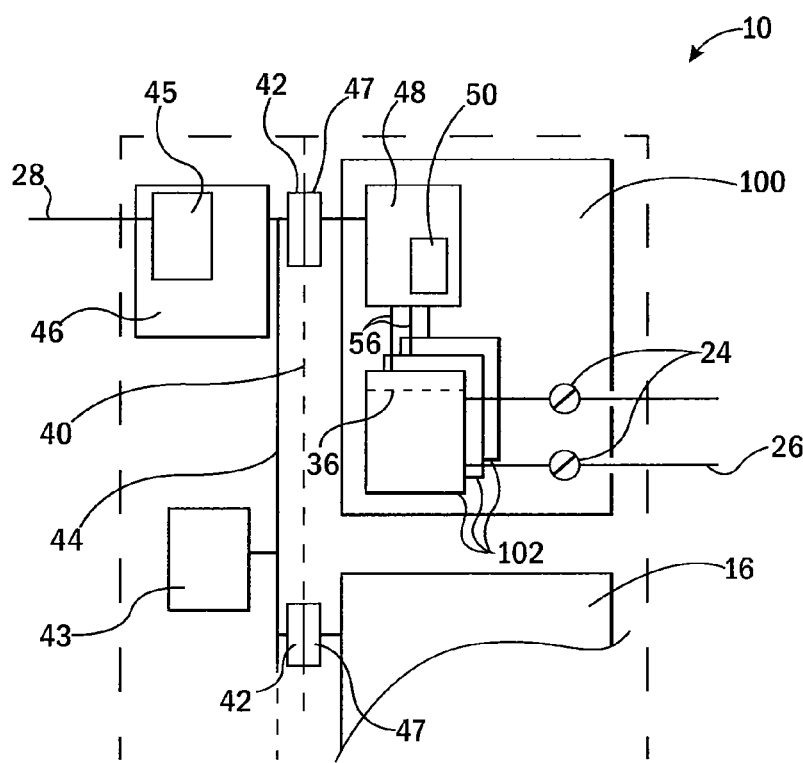
FIG. 8 is a figure similar to FIG. 3 showing a DC output module.

Referring now to FIG. 8, in an alternative embodiment, electrical connectors 42 forming the backplane bus 44 may connect with corresponding electrical connectors 47 positioned at the rear of a dedicated DC output I/O module 100. As discussed above, these interconnections may allow electrical communication between controller-side circuitry of the I/O rack 10 and the controller-side circuitry of the I/O module 100 for directly communicating data and power therebetween when an I/O module 100 is inserted into the I/O rack 10.

Within each I/O module 100, a module controller 48 may execute a stored program 50 to coordinate functions of the I/O module 100 by communicating with multiple output circuits 102. As with the AC I/O module 16 discussed above, these output circuits 102 may provide internally for an isolation barrier 36 between controller-side and field-side circuitry as will be described. Generally, each of these output circuits 102 also communicates with a shared set of terminals 24 (only two shown for clarity) that may, for example, be screw type terminals releasably receiving electrical conductors 26.

The module controller 48 provides a switch state signal 56 for each output circuit 102 indicating a desired control of electrical power at the terminals 24.

Figure 9:
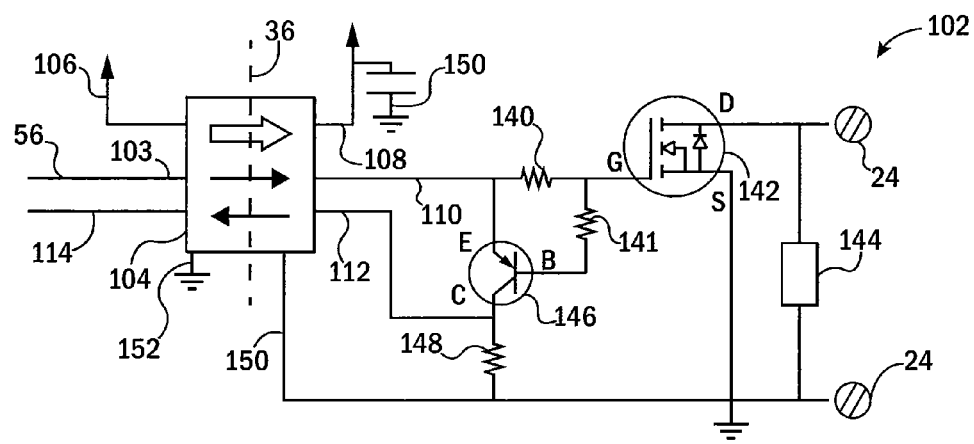
FIG. 9 is a detailed schematic of the power control block of FIG. 8 such as may receive a control signal to control a DC signal at output terminals.

Referring now to FIG. 9, each DC output circuit 102 may receive the switch state signal 56 from the controller 48 at a controller-side data input 103 of a power/data magnetic isolator 104 providing the isolation barrier 36. The switch state signal 56 is relayed in isolated fashion to a field-side data output 110 so as to communicate the information from the state switched signal 56 to the field-side data output 110.

Data may also flow in the opposite direction from a field-side data input 112 through the power/data magnetic isolator 104 to an isolated controller-side data output 114, similarly relaying data received at the field-side data input 112 in isolated fashion to the controller-side data output 114.

Generally, the power/data magnetic isolator 104 will also receive a source of controller-side power 106, for example a DC voltage on the controller-side of the isolation barrier 36 (referenced to controller ground 152 isolated from and floating with respect to ground 150, and will provide a field-side power output 108 providing the same or a different DC voltage derived from the controller-side power 106 (for example, by DC to DC conversion).

Figure 10:
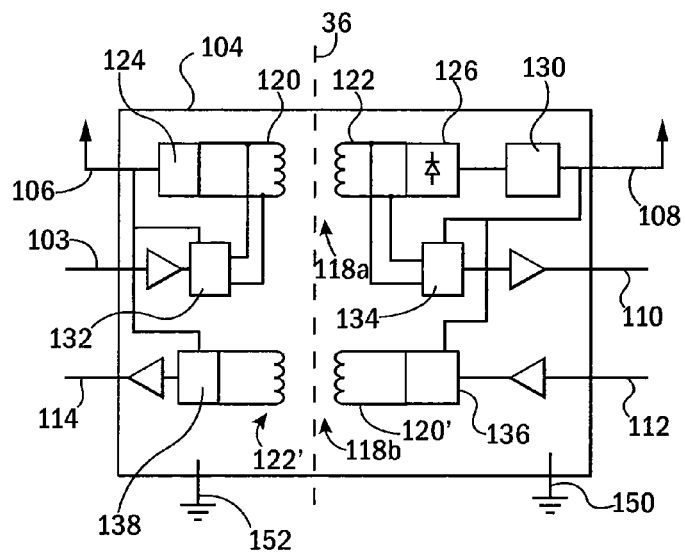
FIG. 10 is a simplified block diagram of a magnetic isolator used in the circuit of FIG. 9.

Referring also to FIG. 10, in one embodiment, the power/data magnetic isolator 104 may provide for a first and second isolation transformer 118a and 118b, each having corresponding primary windings 120 (120') and secondary windings 122 (122') respectively with isolation transformer 118a having its primary winding 120 on the controller-side of the isolation barrier 36 and secondary windings 122 on the field-side of the isolation barrier 36 and transformer 118b having its primary winding 120' on the field-side of the isolation barrier 36 and secondary winding 122' on the controller-side of the isolation barrier 36.

It will be understood that electrical power (and data) communicated between the primary windings 120 (120') and secondary windings 122 (122') will be isolated (meaning that there is no DC electrical conduction path at the operating voltages between the windings) and that the electrical power at the secondary winding will be "floating" with respect to the voltage at the primary winding (meaning generally that there is no DC connection between the ground references for these two voltages within the output circuit 102).

Electrical power may be communicated through the power/data magnetic isolator 104 by transforming the controller-side power 106 at an oscillator 124 into an alternating current waveform driving the primary winding 120 of the first transformer 118a. A corresponding oscillating AC waveform will be received at the secondary winding 122 which may be processed by a rectifier 126 and a voltage regulator 130 to provide a DC power output 108. The particular voltage of the DC power output will depend on the turns ratio of the transformer 118a, the regulation voltage of the voltage regulator 130 which may include DC to DC conversion, for example, through isolated feedback control of the oscillator 124.

Data may be communicated through the power/data magnetic isolator 104, for example, from controller-side data input 103, by providing the data to a modulator 132, for example, converting a binary pulse train into high frequency pulses at the transitions of the pulse train. These high frequency signals may be received by a demodulator 134 connected to the secondary winding 122 to provide data at the field-side data output 110. Generally the electrical power communicated through the power/data magnetic isolator 104 will provide power to the demodulator 134 and a buffer output so that data on the field-side data output 110 is expressed as an electrical signal similar to that obtained through standard logic gate.

Similarly, data received on the field-side data input 112 may be received at modulator 136 to be transmitted to the primary winding 120' of isolation transformer 118b to be conveyed to a corresponding demodulator 138 connected to the secondary winding 122' of the transformer 118b to be provided to the controller-side data output 114.

The transformers 118a and 118b may be implemented, for example, using integrated circuit techniques providing planar coils separated by planar layers of the CMOS circuit or the like. A power/data magnetic isolator 104 suitable for this purpose is commercially available from Analog Devices of Norwood Mass., USA under the trade name of ADuM5201.

Referring again to FIG. 9 the signal 56, as transferred in isolated fashion through the power/data magnetic isolator 104, may pass through a resistor 140 to the gate of a metal oxide semiconductor field effect (MOSFET) transistor 142. Transistor 142 has its drain connected to a first terminal 24 and its source connected to a second terminal 24 of the DC I/O module 100 (shown in FIG. 8). A voltage limiting protective element 144, such as a zener diode or MOV, may be connected across the drain to source to protect the transistor 142 from high voltage spikes applied to the terminals 24 exceeding drain to source output voltage of the transistor 142.

In one embodiment, the transistor 142 may be an auto-protected transistor providing one or more of voltage clamping, current limiting, and temperature protection by internal transistor structures. In the event of over temperature, for example, the path through the transistor 142 between the drain and source may open and the path between the gate and source may be shunted with a low resistance by internal protective mechanisms. A MOSFET transistor suitable for use in this application is commercially available from STMicroelectronics of Geneva, Switzerland under the trade name of OmniFet II.

This and other similar fault condition of the transistor 142 may be detected through the use of a PNP transistor 146 having its base connected through resistor 141 to the junction of resistor 140 and the gate of transistor 142 and having its emitter connected to the junction between resistor 140 and field-side data output 110 of the power/data magnetic isolator 104. A collector of the transistor 146 is connected through resistor 148 to a ground output 150 (providing the reference for output 108) being isolated from a corresponding ground 152 (providing the reference for controller-side power 106) on the controller-side of the isolation barrier 36. A junction between the resistor 148 and a collector of the transistor 146 is connected to the field-side data input 112.

During normal operation of the transistor 142, the emitter and base of transistor 146 will be substantially at equal potential (either both high-voltage or low-voltage) because of the high impedance of the gate of the transistor 142. In this state, the transistor 146 will be off and the voltage at the field-side data input 112 will be low indicating no fault condition.

When a fault of the transistor 142 occurs, the shunting of the gate to the source by a low resistance lowers the voltage on the base of transistor 146 with respect to its emitter (when the field-side data output 110 is in its high state) causing a conduction of the transistor 146 raising the voltage at the field-side data input 112. This voltage at field-side data input 112 is relayed in isolated fashion to controller-side data output 114 to provide an indication to the controller 48 that the connected transistor 142 is in a fault condition.

Referring now to FIGS. 11a and 11b, as discussed above, the use of the MOSFET transistor 142 powered by a floating gate voltage, permit a number of different configurations of the load 20 and field-side power source 22 in connection to the terminals 24 of the I/O module 100. These configurations are possible because the signal at the gate of MOSFET transistor 142 ($V_{gs}$) is independent of the field-side power source 22 and thus unaffected by different configurations of the field-side power source 22 with respect to attachment to the terminals 24. Referring to FIG. 11a, for the control of a DC circuit including DC field-side power source 22', the I/O module 100 may act as a "sinking" module with the load 20 connected between a positive terminal of the field-side power source 22' and one terminal 24 (connected to the drain of transistor 142) and the remaining terminal 24 connected to external ground 85 (not connected to internal ground 150). Alternatively, as shown in FIG. 11b, the positive terminal of the field-side power source 22' may be connected directly to a terminal 24 and the remaining terminal 24 may be connected to the load 20 which then leads to ground 85 in a so-called "سourcing" mode.

Referring now to FIG. 12 as discussed above, in one embodiment, the output circuit 100 may provide for a printed circuit board 90 associated with multiple removable modules 92 and 92' that may be alternatively releasably attached to the printed circuit board 90, for example, through electrical connector sockets 94 on the printed circuit board 90 and corresponding pins 96 on the module 92 or 92'. The module 92 may hold the FET transistors 142 having a first voltage or current characteristic (for example, high-voltage operation) and the module 92' may hold FET transistors 142' having a different voltage or current characteristic (for example, higher current operation but lower voltage operation than transistors 142). The printed circuit board 90 may hold the remaining circuitry of the output circuit 100, allowing the FET transistors 142 to be selected between high-voltage FET transistors and lower voltage higher current FET transistors by simply plugging in one or the other of modules 92 or 92'. In this way, a single I/O module 100 may provide for a wide range of different voltage or current requirements by the replacement of the module 92 or 92' at a distributor or in the field.

It will be appreciated that many modifications may be made to the circuit including, for example, use of the photovoltaic optocoupler 64 with other solid-state switching element configurations including, for example, a single MOSFET having its drain and source connected between terminals 24.

III. AC and DC Output Module

While the FET transistors are described in the above embodiments with respect to switching external field-side AC and DC power, it will be appreciated that they may also be used to switch general analog signals (AC or DC) or to provide effectively bounce less contacts mimicking the operation of a relay or the like.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

Co-pending patent applications entitled Input Circuit For Industrial Control With Low Heat Dissipation Ser. No. 13/474,352 (issued as U.S Pat. No. 9,065,434) and Zero-Crossing Detector For Industrial Control With Low Heat Dissapation Ser. No. 13/474,348 (issued as U.S. Pat. No. 8,669,787) filed on even date herewith and assigned to the same assignee as the present invention are hereby incorporated by reference in their entirety.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications are hereby incorporated herein by reference in their entireties.

What we claim is:

1. An I/O module circuit for use in an industrial control system comprising:
a housing;
terminals supported by the housing for receipt of electrical power to be controlled by the I/O module circuit; and
a circuit contained in the housing providing:
at least one field effect transistor having a source and drain in series between the terminals to control current flow through the terminals according to a first electrical signal received by a gate of the field effect transistor;
an input supported by the housing receiving a second electrical signal indicating a desired control of electrical power at the terminals of the I/O module;
a power isolator receiving, at a first controller-side, the second signal and providing at a second field-side output power and the first signal communicating information of the second signal;
an active pulldown transistor connected between the gate of the at least one field effect transistor and the field side of the power isolator; and
a diode separating the field side of the power isolator from a connection of the active pulldown transistor to the gate of the at least one field effect transistor, wherein a control input of the active pulldown transistor is connected to the field side of the power isolator on one side of the diode and the connection of the active pulldown transistor to the gate of the at least one field effect transistor is on the opposite side of the diode, and wherein the output power is derived from input electrical power received at the first controller-side of the power isolator but isolated and floating with respect to that input power; and
therein the first signal is isolated and floating with respect to the second signal.

2. The I/O module of claim 1 wherein the input electrical power is derived from the second signal.

3. The I/O module of claim 2 wherein the power isolator consists of a photovoltaic stack receiving light from a light source driven by the second signal and wherein the isolated output electrical power and first signal are produced by the photovoltaic stack converting light into electrical energy.

4. The I/O module of claim 1 wherein the input electrical power is independent of the second signal.

5. The I/O module of claim 4 wherein the power isolator consists of at least one transformer having a primary winding of at least one transformer driven by the second signal and wherein the isolated output electrical power and first signal are produced by a secondary winding of the transformer.

6. An I/O module circuit for use in an industrial control system comprising:
a housing;
terminals supported by the housing for receipt of electrical power to be controlled by the I/O module circuit; and
a circuit contained in the housing providing:
at least one field effect transistor having a source and drain in series between the terminals to control current flow through the terminals according to a signal received by a gate of the field effect transistor;
a photovoltaic voltage optical isolator having a photovoltaic stack;
an active pulldown transistor connected between the gate of the at least one field effect transistor and the photovoltaic stack;
a diode separating the photovoltaic stack from a connection of the active pulldown transistor to the gate of the at least one field effect transistor, wherein a control input of the active pulldown transistor is connected to the photovoltaic stack on one side of the diode and the connection of the active pulldown transistor to the gate of the at least one field effect transistor is on the opposite side of the diode; and
an input supported by the housing receiving a signal indicating a desired control of electrical power at the terminals of the I/O module, the signal controlling current through the light emitting diode.

7. The I/O module circuit of claim 6 wherein the circuit contained in the housing includes two series connected field effect transistors and wherein the photovoltaic stack communicates between a junction of sources of the two series connected field effect transistors to gates of the two series connected field effect transistors.

8. The I/O module circuit of claim 7 wherein the two field effect transistors are connected with the drain of a first field effect transistor connected to a first terminal and the source of the first field effect transistor is connected to the source of a second field effect transistor and the drain of second field effect transistor is connected to a second terminal.

9. The I/O module circuit of claim 7 wherein the two field effect transistors are supported by a first module communicating with a circuit card of the circuit, the first module being releasably electrically connected to the circuit card and further including a second module also releasably electrically connectable to the circuit card and holding two different field effect transistors having different voltage or current limits.

10. The I/O module circuit of claim 6 further including a pulldown resistor across a photovoltaic stack.

11. The I/O module circuit of claim 6 further including a zero crossing detector connected to the terminals for detecting a zero crossing of an AC waveform connected to the terminals to control a switching of the field effect transistor to a time proximate to a zero crossing of the AC waveform.

12. The I/O module circuit of claim 11 further including an electronic circuit receiving an input of the zero crossing detector and the signal indicating a desired control of electrical power at the terminals of the I/O module and operating to control application of the signal indicating a desired control of electrical power at the terminals of the I/O module to the light emitting diode to be coincident with a zero crossing of the AC waveform.

13. The I/O module circuit of claim 6 wherein the terminals are screw type terminals.

14. The I/O module circuit of claim 6 further including a rack supporting multiple I/O module circuits each communicating with a network communication circuit for receiving the signal indicating a desired control of electrical power at the terminals of the I/O module from a remote industrial controller; wherein the rack includes elements for orienting and supporting the I/O module in the rack.

15. An industrial control system comprising:
an industrial controller having at least one processor executing a stored program to receive input signals reflecting a state of a connected industrial process and to provide output signals providing desired control of the state of the connected industrial process;
a network providing a protocol ensuring a guaranteed maximum delay in a communication of data on the network system communicating with the industrial controller to communicate input and output signals therewith;

an I/O module communicating with the network system to exchange the input and output signals therewith, the I/O module further comprising;
a housing;
terminals supported by the housing for receipt of electrical power to be controlled by the I/O module circuit; and
a circuit contained in the housing providing:
at least one field effect transistor having a source and drain in series between the terminals to control current flow through the terminals according to a signal received by a gate of the field effect transistor;
a photovoltaic voltage optical isolator hazing a photovoltaic stack;
an active pulldown transistor connected between the gate of the at least one field effect transistor and the photovoltaic stack;
a diode separating the photovoltaic stack from a connection of the active pulldown transistor to the gate of the at least one field effect transistor, wherein a control input of the active pulldown transistor is connected to the photovoltaic stack on one side of the diode and the connection of the active pulldown transistor to the gate of the at least one field effect transistor is on the opposite side of the diode; and
an input supported by the housing receiving a signal indicating a desired control of electrical power at the terminals of the I/O module, the signal controlling current through the light emitting diode.

16. The I/O module circuit of claim 15 wherein the circuit contained in the housing includes two series connected field effect transistors and wherein the two field effect transistors are connected with the source of a first field effect transistor connected to a first terminal and the drain of the first field effect transistor is connected to the source of a second field effect transistor and the drain of the second field effect transistor is connected to a second terminal.

17. The I/O module circuit of claim 15 further including a pulldown resistor across photovoltaic stack.

18. A method of controlling electrical signals in an industrial control system having an I/O module including:
a housing;
terminals supported by the housing for receipt of electrical power to be controlled by the module circuit; and
a circuit contained in the housing providing:
at least one field effect transistor having a source and drain in series between the terminals to control current flow through the terminals according to a signal received by a gate of the field effect transistor;
a photovoltaic voltage optical isolator having a photovoltaic stack;
an active pulldown transistor connected between the gate of the at least one field effect transistor and the photovoltaic stack;
a diode separating the photovoltaic stack from a connection of the active pulldown transistor to the gate of the at least one field effect transistor, wherein a control input of the active Pulldown transistor is connected to the photovoltaic stack on one side of the diode and the connection of the active pulldown transistor to the gate of the at least one field effect transistor is on the opposite side of the diode; and
a releasable electrical connector supported by the housing receiving a signal indicating a desired control of electrical power at the terminals of the I/O module, the signal controlling current through the light emitting diode; the method comprising the steps of:
(a) connecting a source of external electrical power in series with a load to be controlled to the terminals; and
(b) receiving a signal indicating a desired control of electrical power at the terminals from a remote industrial controller.

19. The method of claim 18 wherein step (a) connects an AC voltage source in series with the load to the terminals.

20. The method of claim 18 wherein step (a) connects a positive DC voltage to one terminal and a load to a second terminal.

21. The method of claim 18 wherein step (a) connects a load in series with a positive DC voltage to one terminal and a ground of the DC voltage to a second terminal.

22. An I/O module circuit for use in an industrial control system comprising:
a housing;
terminals supported by the housing for receipt of electrical power to be controlled by the I/O module circuit; and
a circuit contained in the housing providing;
at least one field effect transistor having a source and drain in series between the terminals to control current flow through the terminals according to a first signal received by a gate of the field effect transistor;
at least one transformer coupled isolator receiving input electrical power at a controller side of the at least one transformer coupled isolator referenced to a second signal isolated with respect to the second signal to provide output electrical power at a field side of the at least one transformer coupled isolator referenced to a field side data output floating with respect to the second signal;
a first resistor connected between the gate of the at least one field effect transistor and the field side data output;
a transistor having a base connected between the first resistor and the gate, an emitter connected between the first resistor and the field side data output, and a collector connected to ground via a second resistor; and
a releasable electrical connector supported by the housing receiving the second signal indicating a desired control of electrical power at the terminals of the I/O module.

23. The I/O module of claim 22 wherein the field effect transistor has its source and gate connected to terminals.

24. The I/O module of claim 22 wherein the field effect transistor provides a protective shunting of the gate to a source and an opening of the drain to a source at high power conditions.

25. The I/O module of claim 24 wherein the transformer coupled isolator further receives at the field side a third signal and provides at the controller side an isolated fourth signal derived from the third signal and wherein the third signal provides an indication of a voltage of the gate.

26. The I/O module of claim 22 wherein the the at least one transformer coupled isolator includes a modulator transmitting short pulses corresponding to controller side data.

27. The I/O module of claim 22 wherein the power isolator provides a DC to DC converter.

* * * * *